United States Patent [19]

Landi et al.

[11] Patent Number: 4,647,125
[45] Date of Patent: Mar. 3, 1987

[54] SOLDERLESS CONNECTOR TECHNIQUE

[75] Inventors: Vincent R. Landi, Danielson, Conn.; Edwin R. Rowlands, Spring Hill, Fla.

[73] Assignee: Rogers Corporation, Rogers, Conn.

[21] Appl. No.: 757,602

[22] Filed: Jul. 22, 1985

[51] Int. Cl.[4] .............................................. H01R 9/07
[52] U.S. Cl. .................................... 339/17 F; 29/873
[58] Field of Search ............ 339/17 F, 75 M, 75 MP, 339/59 M, 61 M, 176 MF; 29/869–873; 174/88 R, 88 S

[56] References Cited

U.S. PATENT DOCUMENTS

| | | | |
|---|---|---|---|
| 3,088,090 | 4/1963 | Cole et al. | 339/17 F |
| 3,562,798 | 2/1971 | Bragg, Jr. | 339/17 F |

FOREIGN PATENT DOCUMENTS

| | | | |
|---|---|---|---|
| 629854 | 10/1961 | Canada | 29/873 |
| 1167515 | 10/1969 | United Kingdom | 339/17 F |

OTHER PUBLICATIONS

IBM Bulletin, Webb, vol. 5, No. 11, p. 22, 4-1963.
IBM Bulletin, Abbatecola, vol. 10, No. 10, p. 1462, 3-1968.

Primary Examiner—Neil Abrams
Attorney, Agent, or Firm—Fishman & Dionne

[57] ABSTRACT

A solderless connector especially suited for interconnecting a flexible circuit to another circuit or component, either rigid or flexible, is presented. The solderless connector of the present invention utilizes the pressure mating of contact areas with the added advantage of a wiping or cleaning action on the contacting surfaces. In one embodiment of the present invention, this wiping action is achieved by bending or crimping the two layers adjacent to the contact areas, thereby causing them to have mutual relative sliding motion over each other as they are being pressed into contact therebetween. In another embodiment, the bending or crimping of the flexible circuit layers is accomplished in the structure of the solderless connector itself.

13 Claims, 17 Drawing Figures

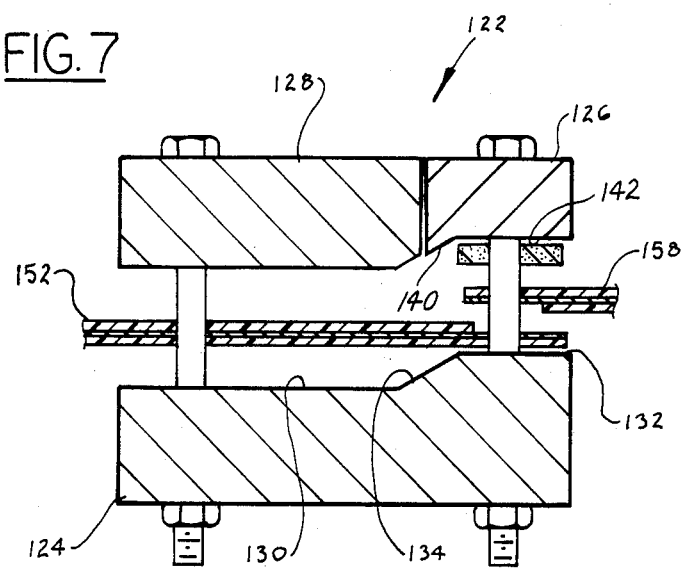

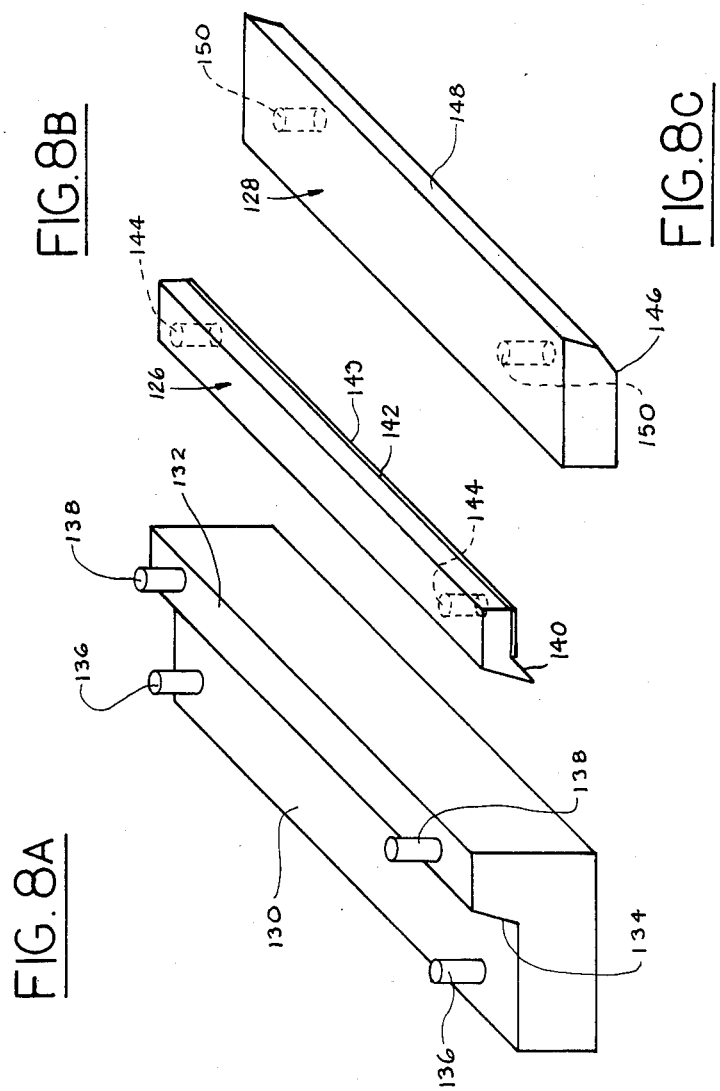

SOLDERLESS CONNECTOR TECHNIQUE

BACKGROUND OF THE IVENTION

This invention relates to a method and apparatus for interconnecting electrical circuit elements. More particularly, this invention relates to a new and improved solderless connector and method of using the same for establishing electrical contact between a flexible circuit and another circuit device utilizing relative motion therebetween to wipe away any debris or other foreign matter (i.e., corrosive films) which may adversely affect electrical contact.

Conventional methods of interconnecting electrical or electronic circuit components consist of the use of separate connector structures and/or soldering terminals on the components to conductors which deliver current to or from the components. While generally suitable for its intended purposes, interconnecting electrical components via separate connector structures does suffer from certain drawbacks and deficiencies including high manufacturing and purchasing costs as well as increased labor time and costs during installation and connection. Similarly, soldering terminals is undesirable as the substrate which supports an exposed terminal must be able to withstand relatively high temperatures with no adverse effects. Also, soldering connections can be time consuming and therefore be labor intensive and expensive. Another problem with soldered connections is the relative difficulty in disconnecting a soldered terminal during repairs and manufacturing.

In some applications it has been found desirable to replace the use of separate connecting structures and/or soldering as a technique for use in establishing connections to flexible and other circuits. In these applications, the requisite electrical contact may be established by mechanically pressing the terminal portions of the circuit against terminal pads on the connector, device or another circuit. Such prior art pressure connections are customarily made with the aid of a solid resilient pressure applicator, such as an elastomeric member, which is placed in compression to bias at least one of the components to be electrically interconnected toward the other component to hold the terminal portions thereof in electrical contact. Such a solderless connection system is disclosed in U.S. Pat. No. 4,468,074, assigned to the assignee hereof and incorporated herein by reference.

U.S Pat. No. 4,468,074 discloses an apparatus wherein contact portions of a first array of conductive elements are urged against mating contacts of a second array of conductive elements by a pressure applicator comprising a resilient open-celled plastic material thereby establishing and maintaining an electrical connection therebetween. The use of such an open-celled resilient material permits a plurality of closely spaced exposed electrical conductors on or extending from a pair of substrates to be aligned and thereafter reliably pressed together; with the electrical connections being established by a requisite contact pressure applied to the substrates. The solderless connector of U.S. Pat. No. 4,468,074 may be employed to interconnect flexible circuits; to connect flexible circuits to circuits on rigid substrates; to establish connections between the leads extending from integrated circuit in a circuit pattern on a flexible or rigid circuit board; and in other applications.

It is well known that conventional electrical connector devices, such as of the male/female type, utilize mutual or relative sliding motion during the connecting process. This relative motion between the cooperating male and female connectors is desirable as it acts to "wipe" away any debris or foreign matter on the connectors. Such debris may adversely effect electrical contact. While suitable for its intended purposes, the solderless connector of U.S. Pat. No. 4,468,074 will not necessarily provide such relative motion between the flexible circuit and other circuit devices which are to be interconnected. This is because the circuit devices are interconnected when one device is brought down and disposed on another device thereby precluding any lateral movement which would act to wipe away undesirable foreign matter. Consequently, dirt, debris and other foreign matter may still be present on the respective electrical contacts subsequent to interconnection, which may lead to unreliable contacting.

Another area of concern with the "non-wiping" solderless connectors of the type disclosed in U.S. Pat. No. 4,468,074 is the open aging of the circuits before assembly. During exposure to the normal levels of corrosive gases common in air, the metal contact surfaces can corrode, reducing the electrical performance when assembled. As mentioned hereinabove, a typical method for improving the performance of connectors is to provide for a sliding motion between the contacts as they are mated. This sliding action breaks through the non-conductive corrosion layers that have formed and thus improves the electrical performance of the connector.

SUMMARY OF THE INVENTION

The above discussed and other problems of the prior art are overcome or reduced by the solderless connection technique of the present invention. In accordance with the present invention, a relatively simple method and apparatus for producing "wiping" or sliding action between the mating contacts of a pair of flexible circuits is provided. In a first embodiment of the present invention, this relative sliding motion is achieved by crimping the two layers adjacent to the contact areas, thereby causing them to slide over each other as they are pressed into contact with one another. Providing sliding motion utilizing a crimping action can be achieved at low cost using virtually the same construction for solderless connectors as is disclosed in U.S. Pat. No. 4,468,074. Thus, as the two flexible circuits are pressed or crimped together, there will be a small amount of sliding between the contacts as they are flattened into a planar configuration. Such a sliding action will act to wipe away any debris or foreign matter on the connectors as well as removing any corrosive films which have formed thereon.

In a second embodiment of the present invention, the bending or crimping of the flexible circuit layers is accomplished in the structure of the solderless connector itself. Such an embodiment may be preferable as it would preclude the use of a special crimping tool or crimping step necessitated with the first embodiment. As a result of either embodiments, the present invention provides improved electrical performance and reliable contacting to a solderless connector such as the type disclosed in U.S. Pat. No. 4,468,074. Also, the instant invention permits electrical connections between a flexible circuit and another flexible circuit, a rigid circuit or an electronic component.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES;

FIG. 7 is a cross-sectional elevation view of a three piece solderless connector in accordance with the second embodiment of the present invention;

FIGS. 8A-8C are perspective exploded views of the three piece solderless connector of FIG. 7;

DESCRIPTION OF THE PREFERRED EMBODIMENT

Figure 1:
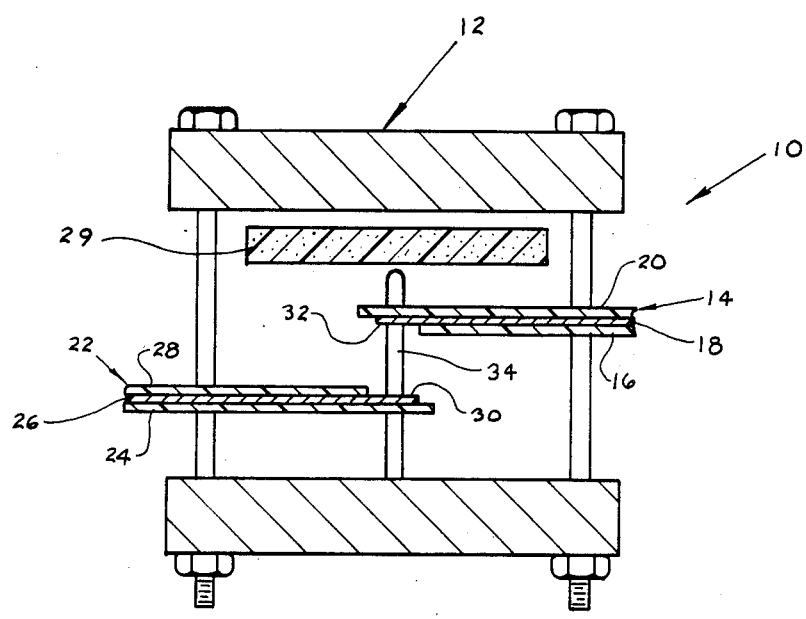
FIG. 1 is a cross-sectional elevation view of a solderless connector in accordance with the prior art.

Referring first to FIG. 1, a solderless connector in accordance with the prior art is shown generally at 10. Solderless connector 10 comprises a clamp frame 12 which is adapted to sandwich a flexible circuit 14 comprising a substrate 16 having a conductor contact area 18 thereon with a protective cover film 20 positioned over the conductive contact area 18, against a flexible circuit 22 which similarly comprises a substrate 24 having a conductive contact area 26 thereon with a protective cover film 28 on the conductive contact area 26. Clamp frame 12 effects reliable electrical contact between the two flexible circuit layers 14 and 22 via the stress transmitted by an elastomeric resilient pad 29. Thus, the mechanical clamp means 12 maintains a certain minimal contact pressure between exposed terminal portions 30 and 32 of conductive contacts 18 and 26, respectively, via the elastomer 28 to effect an electrical connection therebetween. Preferably, at least two alignment posts (one on either side of the contact regions) identified at 34 is provided to effect proper alignment between the conductive contacts 18 and 26 of the respective flexible circuits 14 and 22.

While suitable for its intended purposes, the prior art solderless connector of FIG. 1 will not provide any relative motion between the pair of flexible circuits when the exposed terminal portions 30 and 32 are brought into electrical contact. As mentioned hereinabove, this lack of relative sliding motion or "wiping" presents several disadvantages. Thus, for example, debris or other foreign matter present on the terminal portions of the connectors will remain thereon even after electrical interconnection, thereby adversely affecting the reliability of said connection. Also, any corrosive films which may have been formed on the respective terminal portions 30 and 32 will remain on the terminal portion surfaces even after electrical interconnection thereby also having an adverse effect on the reliability of said connection.

Figure 2:
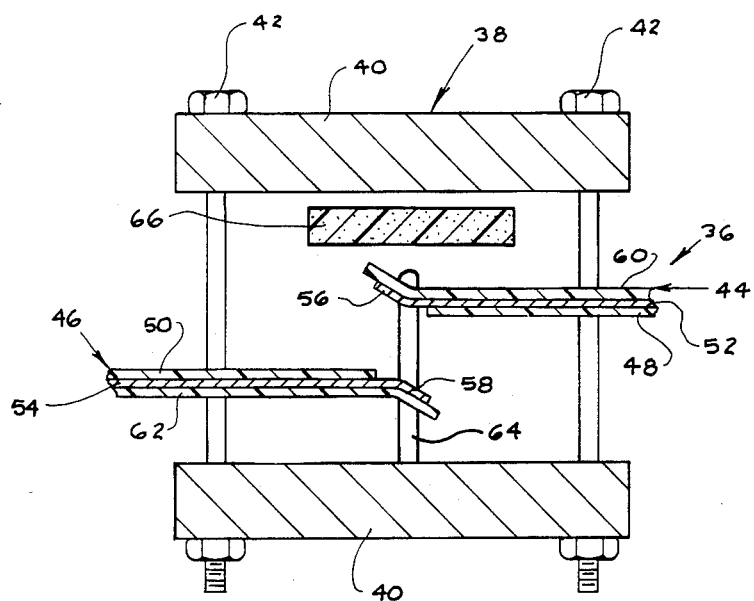
FIG. 2 is a cross-sectional elevation view of a technique for the solderless interconnection of flexible circuits in accordance with the first embodiment of the present invention.

The above discussed disadvantages associated with the prior art solderless connector of FIG. 1 are overcome or alleviated by the technique for the solderless interconnection of flexible circuits in accordance with the present invention. Turning now to FIG. 2, a solderless connector identified at 36 and which provides wiping action between the respective terminals or contacts during the connection process is shown. Solderless connector 36 includes a clamp frame 38 which is comprised of a pair of rigid plates 40 connected by two bolts or clamps 42. Solderless connector 36 also includes a pair of flexible circuits 44 and 46 each respectively comprising a base or substrate 48 and 50, a conductive pattern 52 and 54 having exposed terminal portions 56 and 58 and cover films 60 and 62. As in the FIG. 1 embodiment, alignment posts 64 (identical to alignment posts 39 in FIG. 1) are provided to align the two flexible circuits 44 and 46 and an elastomeric resilient pad 66 is provided to exert contact pressure and effect a reliable electrical connection. A significant feature of the present invention is that the two flexible circuits 44 and 46 are each crimped or bent at the two ends having the terminal portions 56 and 58 thereon as is clearly shown in FIG. 3. Thus, as the clamp frame is tightened and the elastomeric pad 64 exerts pressure against the flexible circuits 44 and 46, the circuits will be pressed together and flattened. Simultaneously, the mating contact areas or terminal portions 56 and 58 will be caused to slide over each other as they are pressed into contact with one another. This sliding or relative motion between the two terminal portions 56 and 58 will provide the necessary wiping action which will remove any debris or other foreign matter; and will also remove undesirable corrosive films formed on the contact terminals.

Figure 3:
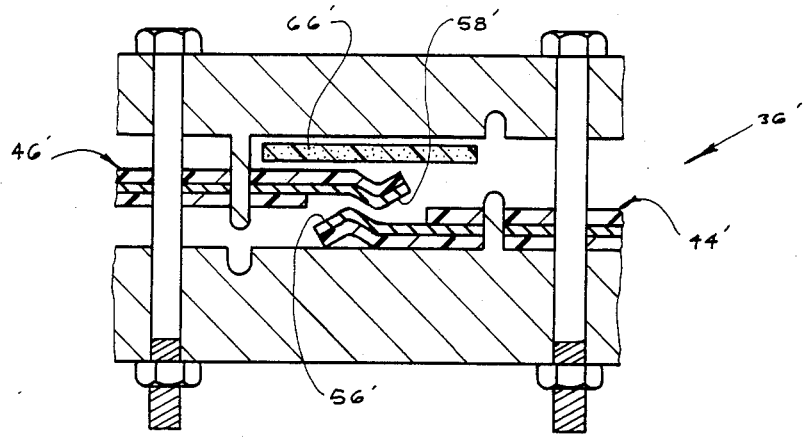
FIG. 3 is a cross-sectional elevation view, similar to FIG. 2, showing a technique for the solderless interconnection of flexible circuits in accordance with the present invention.

Referring now to FIG. 3, another embodiment of the present invention is shown. It will be appreciated that the clamp frame and resilient elastomeric pad are virtually identical to the corresponding structures described in FIG. 2 and so the same reference numerals are being used with the addition of a prime. In FIG. 3, a stronger wiping action then can be achieved by the single crimp or bend of FIG. 2 is provided by bending the ends (terminal portions 56' and 58') of the two circuits 44' and 46' with two bends or crimps. Moreover, terminal portions 56' and 58' are preferably misaligned in the direction of induced motion by between 0.005-0.010 inches to promote a stronger and longer wiping action.

It will be appreciated that while the embodiments of the present invention set forth in FIGS. 2 and 3 are shown utilizing two (or two sets) of alignment posts, those embodiments may also use existing alignment posts such as are disclosed in the non-wiping prior art FIG. 1. In fact, an important feature of the crimping solderless connector of the instant invention is the capability of using the same fixtures as the non-wiping connector of FIG. 1, i.e., one set of alignment posts rather than two.

In the embodiments of FIGS. 2 and 3, a special crimping tool will be necessitated to effect the bend or bends in the terminal portions of each flexible circuit which is to be connected. A preferred alternative to necessitating such a special crimping step would be to provide the bending or crimping in the structure of the solderless connector itself. Embodiments of the present invention which would preclude the use of such a special crimping tool or crimping step are described in FIGS. 4–11.

Figure 4A:
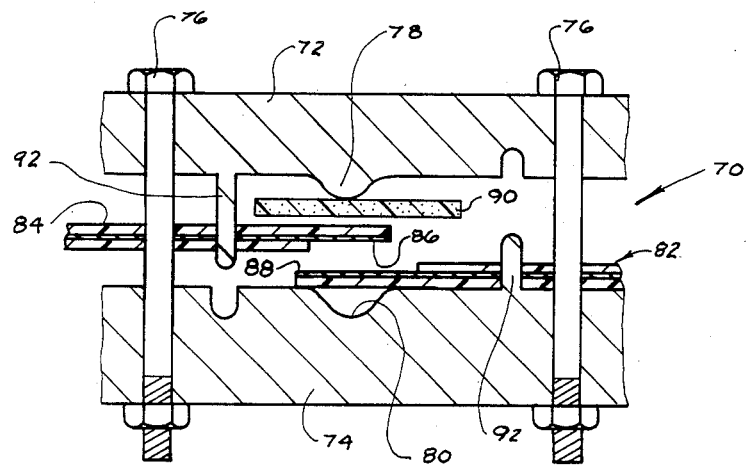
FIG. 4A is a cross-sectional elevation view showing a technique for the solderless interconnection of flexible circuits in accordance with the second embodiment of the present invention.
Figure 4B:
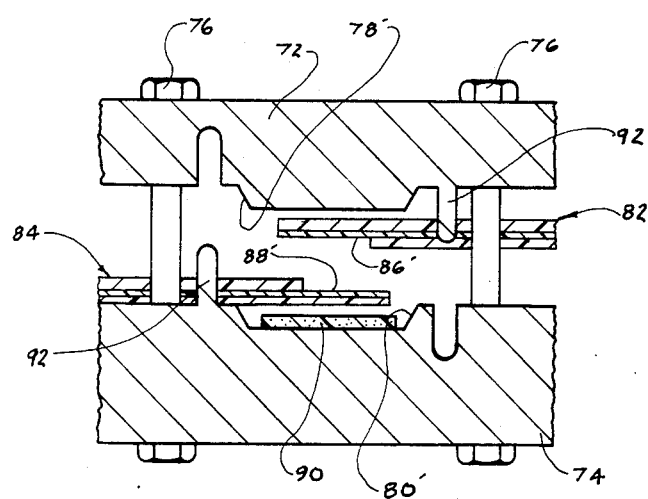
FIG. 4B is a cross-sectional elevation view, similar to FIG. 4A, of a solderless connector in accordance with the present invention.

In FIG. 4A, a solderless connector identified at 70 comprises a pair of rigid plates 72 and 74 interconnected by clamps or bolts 76. Rigid plates 72 and 74 include a cooperating arcuate protrusion 78 and corresponding arcuate recess 80. It will be appreciated that arcuate protrusion 78 and arcuate recess 80 may have any desired configuration so long as relative movement between the flexible circuits results during connection. For example, in FIG. 4B, cooperating protrusion 78' has a flattened wedge shape, i.e., depending converging sidewalls connected by a flat surface, while recess 80' has a cooperating opening which receives wedged shaped protrusion 78'. As in the prior art FIG. 1 embodiment, a pair of conventional flexible circuits 82 and 84 each having exposed terminal contact portions 86 and 88 are sandwiched between rigid plates 72 and 74 along with an elastomeric resilient pad 90. Rigid frames 72 and 74 also include at least a pair of alignment pins 92 for aligning flexible circuits 82 and 84 during electrical interconnection. Thus, when clamps or bolts 76 are tightened, rigid frame 72 and 74 will bring flexible circuits 82 and 84 into contact via the stress transmitted by elastomeric pad 90. Under this contact pressure exerted by elastomeric pad 90, protrusion 78 or 78' on rigid plate 72 will act to bend or crimp the terminal portion of flexible circuits 82 and 84 so as to deform the flexible circuits into the recess shown at 80 or 80'. Simultaneously, terminal contact portions 86 and 88 of flexible circuits 82 and 84 will undergo a sliding motion relative to one another as they are deformed within recess 80 or 80'. This sliding motion will thus provide the necessary wiping action to clear away any foreign matter or corrosive film present on terminal portions 86 and 88. The solderless connector embodiment of FIG. 4A and 4B thus provides crimping or bending means which is integrated directly into the clamp frame of the solderless connector thereby avoiding the use of special crimping tools or a special crimping step prior to interconnection.

Figure 5:
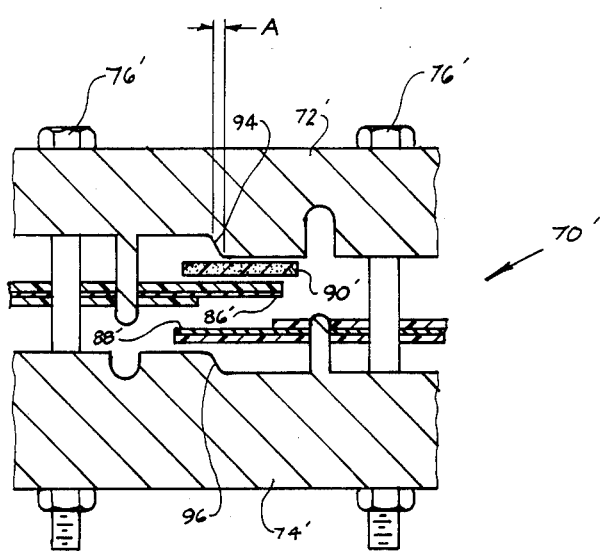
FIG. 5 is a cross-sectional elevation view showing a technique for the solderless interconnection of flexible circuits in accordance with the second embodiment of the present invention.

Similarly, in FIG. 5, another solderless connector 70' is shown which also includes means for automatically crimping the flexible circuits, the crimping means being integrated directly on the mechanical clamping means which is comprised of rigid clamp frame 72' and 74' and bolts 76'. However, unlike the cooperating protrusion 78 or 78' and corresponding recess 80 or 80' of the FIGS. 4A and 4B embodiments, in FIG. 5, a cooperating step structure consisting of a shoulder 94 on rigid plates 72', and a corresponding shoulder 96 on rigid 74', act as the means to automatically provide crimping between contact terminals 86', and 88' of flexible circuits 82 and 84, respectively. In a preferred embodiment, shoulder 94 and 96 are laterally offset from one another the distance of about 3–4 times the thickness of the flexible circuit material which is being interconnected. This offset distance is identified in FIG. 5 by the letter "A". It will be appreciated that the effectiveness of the offset "A" in FIG. 5 is dependent upon the thickness of the elastomer element 90' as well as the flexible circuit thicknesses.

Figure 6A:
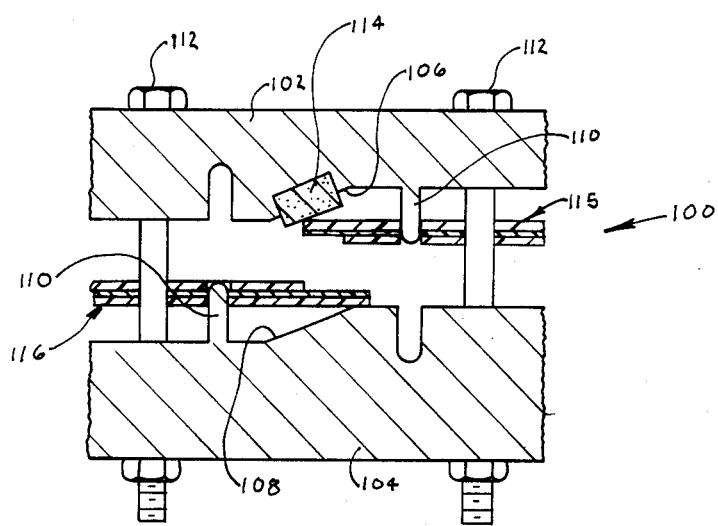
FIG. 6A is still another cross-sectional elevation view of a solderless connector in accordance with the second embodiment of the present invention.
Figure 6B:
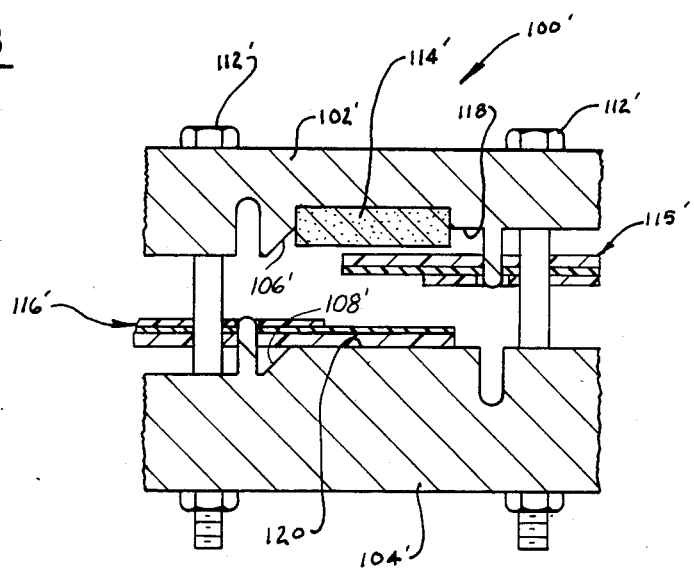
FIG. 6B is a cross-sectional elevation view, similar to FIG. 6A, of a solderless connector in accordance with the present invention.

Turning now to FIGS. 6A and 6B, relatively simple constructions of clamp frames which include means to bend or crimp flexible circuits during the connection process are shown. In FIG. 6A, clamp frame 100 comprises a pair of rigid plates 102 and 104 which simply include corresponding ramp sections 106 and 108 therein. As in the other embodiments, the solderless connector of FIG. 6A also includes a pair of indexing pins 110 for aligning the flexible circuits along with suitable means, such as bolts 112, for providing force against elastomeric pad 114 during connection. It will be appreciated that during connection, some movement between flexible circuits 115 and 116 will occur at the sloped portions 106 and 108 as the rigid plates 102 and 104 are clamped together. This relative movement will provide the necessary sliding action which will wipe away any foreign material as has been discussed hereinabove.

In FIG. 6B, a similar clamp frame 100' is shown. The principle difference between clamp frame 100' of FIG. 6B and clamp frame 100 of FIG. 6A is that in FIG. 6B, the connection between flexible circuit 115' and 116' is effected at a planar portion 118 and 120 which is positioned above slope portions 106' and 108' of rigid plates 102' and 104'. Nevertheless, the clamp frame 100' in FIG. 6B will provide the same important relative motion between flexible circuits 114' and 116' during connection as the flex circuits are bent or crimped by the rigid plates 102' and 104'.

As was discussed with regard to the embodiments of FIGS. 2 and 3, the embodiments of FIGS. 4–6 may also be used with only a single set of alignment posts similar to the non-wiping embodiment of FIG. 1.

While FIGS. 6A and 6B show relatively simple constructions and methods of providing bending and crimping to flexible circuits via the rigid clamp frame itself, FIGS. 7–11 are illustrative of a more complicated, yet extremely effective solderless connector of the same general type. The solderless connector of FIGS. 7–11 is shown generally in FIG. 7 at 122 and comprises three distinct and cooperating parts including a base section 124, a first top or cover section 126 and a second top or cover section 128. Base section 124 is a rigid block which includes a stepped top surface comprising lower surface 130 and upper surface 132 connected by ramp 134. Base 124 also includes a first pair of indexing posts 136 on lower surface 130 and a second pair of indexing posts 138 on upper surface 132 for the flex circuits extending upwardly from each of the upper and lower surfaces (see FIG. 8A).

First top section 126 also comprises a rigid block having opposing upper and lower surfaces. The lower surface of first top portion 126 has a configuration comprising planar surface 142 which corresponds to upper planar surface 132 of base portion 124. The lower surface of first top portion 126 also includes a lip 140. Finally, first top section 126 also includes a pair of holes 144 for receiving indexing posts 138 of base 124 and a resilient elastomeric pad 143 for effecting electrical interconnection as has been discussed with regard to the previous embodiments. Second top portion 128 is a rigid block having opposing upper and lower surfaces wherein the lower surface includes a flat planar section 146 corresponding to the lower surface 130 of base 132 and a sloped or ramp section 148 corresponding and adapted to cooperate with the ramp section 134 of base 124. Second top portion 128 also includes a pair of receiving holes 150 for receiving aligning posts 136 of base portion 124.

Figure 9B:
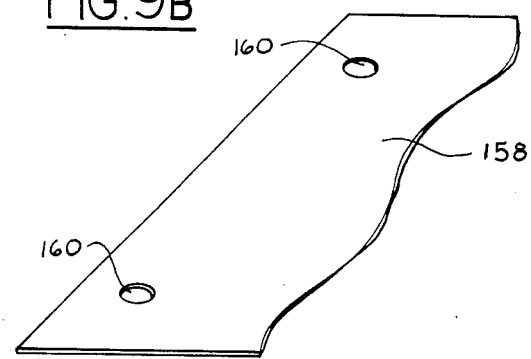
FIG. 9B is an enlarged perspective view of a top flexible circuit sheet used in accordance with the solderless connector of FIG. 7.
Figure 9A:
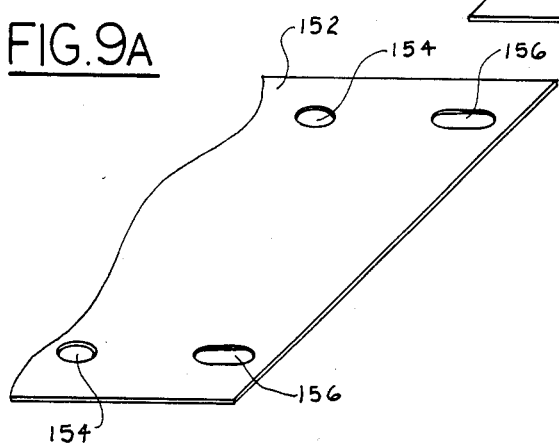
FIG. 9A is an enlarged perspective view of a lower flexible circuit sheet used in accordance with the solderless connector of FIG. 7.

Referring to FIGS. 9A and 9B, end portions of the flexible circuits used in conjunction with the connector assembly of FIG. 7 are shown. In FIG. 9A, lower flexible circuit 152 is shown and includes openings 154 which correspond to and receive indexing posts 136 of base 124 and elongated slots 156 which correspond to and receive indexing posts 138 of base 124. Note that in FIG. 10, lower flexible circuit 152 is shown after being placed on and received by the aligning posts 136 and 138 of base portion 124. In FIG. 9B, an end portion of upper or top flexible circuit 158 is shown and includes a pair of openings 160 which correspond to and are adapted to receive alignment posts 138 of base portion 124.

Figure 10:
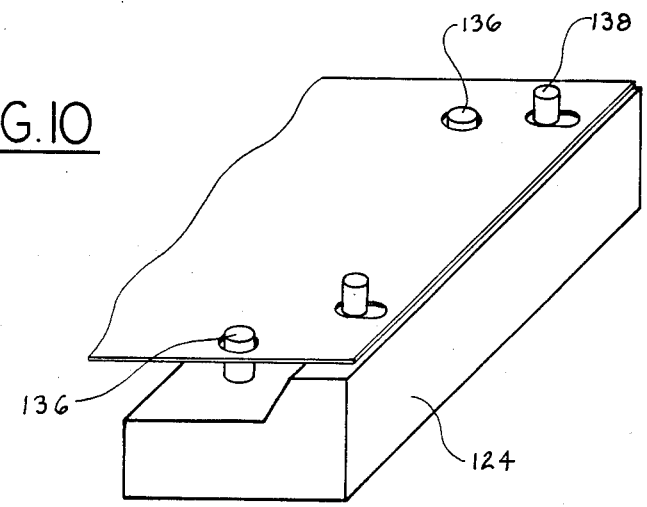
FIG. 10 is a perspective view of a partial assembly of the solderless connector of FIG. 7.
Figure 11A:
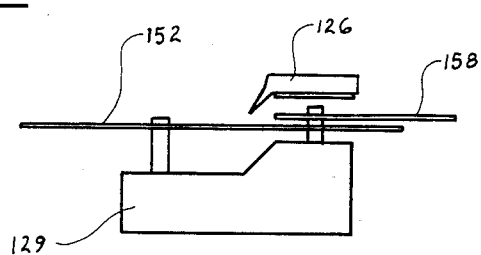
FIGS. 11A-11B are side elevation views showing first and second steps in assembling the solderless connector of FIG. 7.
Figure 11B:
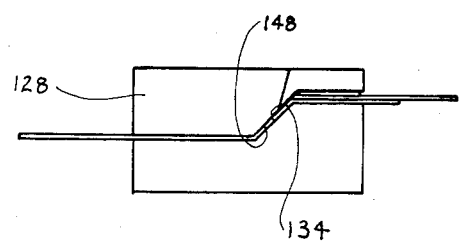

Turning now to FIGS. 11A and 11B, the sequential method of using the solderless connector of FIG. 7 is shown. In FIG. 11A, lower circuit 152 has been positioned on base 124 as shown in FIG. 10. Next, first top portion 126 is placed onto the indexing post 138 of base 124 whereupon indexing post 138 will be received by openings 144 therein. At this point, upper circuit 158 and lower circuit 152 will be firmly secured to one another by first top portion 126. Turning now to FIG. 11B, second top portion 128 is then placed onto indexing posts 136 of base 134 such that openings 150 are received by the indexing posts. As second top portion 128 is moved in the direction indicated by the arrow (downwardly), ramp section 148 of rigid piece 128 and corresponding ramp section 134 of base 124 will contact the flexible circuits and provide relative movement therebetween much the same way as the corresponding ramps 106 and 108 of clamp frame 100 described with regard to FIG. 6A. Note that this relative movement between the flexible circuits is permitted as elongated slot 156 permits a small amount of movement for the lower circuit 152. It will be appreciated that lip 140 has been provided to insure that top section 126 is attached to base portion 124 prior to top portion 128 being attached to the base.

It will be appreciated that the embodiment of FIGS. 7-11 is quite similar to the embodiment shown in FIG. 6B with a change in alignment post positions. However, this is an important difference as it provides an important feature of the FIG. 7 embodiment. In FIGS. 7-11, the connector 122 provides for complete compression of the elastomer to the ultimate force reached in the connector, all before wiping takes place. This is in comparison to the earlier embodiments which produce wiping during the compression mating of the circuits, thus providing the wiping at less than the maximum compressive force.

The several embodiments of the present invention as described hereinabove provide a relatively inexpensive and uncomplicated method of achieving wiping or sliding motion between contacts of flexible circuits during a solderless type interconnection. This relatively simple interconnection method is achieved by crimping or bending the flexible circuits at the terminal areas so that when the circuits are pressed together, there will be a small amount of sliding between the contacts as they are being flattened. This may be accomplished by either initially crimping the flexible circuits as shown in the embodiments of FIGS. 2 and 3; or by bending the flexible circuits during interconnection thereof using the rigid clamp frame itself as is set forth in the embodiments of FIGS. 4-11. Also, it should be understood that the embodiments of FIGS. 3, 6B and 7-11 are also well suited to be used in conjunction with a rigid circuit or component to flexible circuit connection; rather than both circuits being flexible. Thus, the present invention permits connections between flexible circuits and another flexible circuit, a rigid circuit or an electronic component. As already mentioned, the present invention is well suited to be used in conjunction with a solderless connector and solderless connection technique such as that described in U.S. Pat. No. 4,468,074.

In accordance with the present invention, the material which defines the elastomeric pad of FIGS. 2-11 preferably consists of an open celled visco-elastic polymer and, in the preferred embodiment, a polyurethane foam. Particularly good results have been obtained employing a urethane formulation comprising a mixed polyester/polyether system. One open cell material suitable for use in the practice of the present invention is FCD 2200 obtainable from Rogers Corporation. This material is characterized by a compressive load deflection at 25% compression in the range of 5 to 50 psi. A resilient material for use in the present invention is preferably characterized by a compression set of less than 5%. The compression set is tested in accordance with ASTM standard D-1564 wherein a two inch square and one inch thick stack of sheets of material (about 60 mils/sheet) are compressed 50% to ½ inch thickness, the compressed material is subjected to 158° F. for 22 hours, the compressions is released and the thickness is measured. The compression set of the FCD 2200 material after 5 hours of steam autoclaving prior to performing test ASTM D-1564 is less than 10%.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. In a solderless connector wherein clamp frame means applies force against an elastomeric element distributing the force to thereby effect electrical contact or mating between terminal portions of circuit devices, at least one of the circuit devices being a flexible circuit device, and wherein the clamp frame means includes a pair of rigid plate means, the improvement comprising:
   means incorporated in at least one of said rigid plate means for bending at least one of the flexible circuit devices to be connected, said bending means providing relative wiping between said terminal portions of said circuit devices;
   alignment means extending from said rigid plate means; and said circuit devices including openings therethrough for receiving said alignment means, said openings being larger than said alignment means;

wherein said alignment means precludes lateral movement between said circuit devices but allows relative motion and wiping between said terminal portions of said circuit devices.

2. The solderless connector of claim 1 wherein said bending means comprises:

a first ramped surface in one of said rigid plate means and a corresponding second ramped surface in the other of said rigid plate means.

3. The solderless connector of claim 2 wherein:

said terminal portions are positioned between said first and second ramped surfaces.

4. The solderless connector of claim 2 including:

corresponding planar surfaces on said pair of rigid plate means and disposed on at least one side of said first and second ramped surfaces, said terminal portions being positioned between said corresponding planar surfaces.

5. The solderless connector of claim 1 wherein said bending means comprises:

a protrusion extending from one of said rigid plate means; and a corresponding recess disposed in the other of said rigid plate means, said recess being disposed across from said protrusion and having a shape conforming to said protrusion wherein said terminal portions are positioned between said protrusion and recess.

6. The solderless connector of claim 5 wherein said protrusion and recess have an arcuate shape.

7. The solderless connector of claim 5 wherein said protrusion and recess have a wedge shape.

8. The solderless connector of claim 1 wherein said bending means comprises:

at least one cooperating step in each of said rigid plate means, each of said cooperating steps including a shoulder and wherein said terminal portions are positioned between said cooperating steps.

9. The solderless connector of claim 8 wherein said shoulders are laterally offset from one another a preselected distance.

10. The solderless connector of claim 9 wherein said lateral offset is about 3–4 times the thickness of the flexible circuit devices to be connected.

11. The solderless connector of claim 1 wherein said bending means comprises:

base portion means, said base portion means having upper and lower parallel surfaces separated by a ramp, said upper and lower surfaces including said alignment means extending from said base portion means upper surface;

second top portion means having upper and lower surface, said lower surface having a shape which corresponds to said lower surface and ramp of said base portion means, said second top portion including openings adapted to receive said alignment means extending from said base portion means.

12. The solderless connector of claim 11 wherein:

at least one of said openings is elongated.

13. The solderless connector of claim 11 including:

a lip along said planar opposed surface of said first top portion.

* * * * *